United States Patent
Summer

(10) Patent No.: US 8,605,466 B2
(45) Date of Patent: Dec. 10, 2013

(54) RADIATION HARDENED MOTOR DRIVE STAGE

(76) Inventor: Steven E. Summer, Shirley, NY (US)

( * ) Notice: Subject to any disclaimer, the term of this patent is extended or adjusted under 35 U.S.C. 154(b) by 636 days.

(21) Appl. No.: 12/655,239

(22) Filed: Dec. 28, 2009

(65) Prior Publication Data

US 2011/0156628 A1   Jun. 30, 2011

(51) Int. Cl.
H02M 3/335 (2006.01)

(52) U.S. Cl.
USPC ........ 363/21.12; 363/123; 363/159; 327/108; 327/534; 318/400.27; 257/428; 257/659; 257/660

(58) Field of Classification Search
USPC ............... 318/685, 696, 432, 439, 571, 560, 318/400.26, 400.27, 722, 800; 257/921, 257/299, 428, 659, 660, E51.012, E31.001, 257/E27.127, E25.004; 363/21.12, 123, 363/159; 327/108, 534
See application file for complete search history.

(56) References Cited

U.S. PATENT DOCUMENTS

| | | | |
|---|---|---|---|
| 3,836,836 A | 9/1974 | Cowett, Jr. | |
| 3,976,984 A | 8/1976 | Hirasawa | |
| 4,109,163 A | 8/1978 | Cricchi et al. | |
| 4,924,158 A | 5/1990 | Kelley et al. | |
| 5,059,992 A | 10/1991 | Akiike | |
| RE34,399 E * | 10/1993 | Gami et al. | 360/73.01 |
| 5,317,175 A | 5/1994 | Throngnumchai | |
| 5,442,218 A | 8/1995 | Seidel et al. | |
| 6,081,091 A | 6/2000 | Mitchell et al. | |
| 6,664,601 B1 | 12/2003 | King | |
| 6,897,706 B2 | 5/2005 | Coutu | |
| 6,982,883 B2 * | 1/2006 | Summer | 363/21.12 |
| 7,005,711 B2 | 2/2006 | King | |
| 7,294,983 B2 | 11/2007 | Yokoo | |
| 7,477,096 B2 * | 1/2009 | Summer | 327/543 |
| 7,755,320 B2 * | 7/2010 | Kawakami et al. | 318/811 |
| 2010/0116571 A1 * | 5/2010 | Suzuki | 180/65.25 |

* cited by examiner

*Primary Examiner* — Antony M Paul
(74) *Attorney, Agent, or Firm* — Stephen E. Feldman; Feldman Law Group, P.C.

(57) ABSTRACT

A radiation hardened motor drive stage utilizes a non-radiation hardened P-channel FET switch. The radiation hardened motor drive stage includes a non-radiation hardened P-channel FET switch that is connected three (3) pairs of upper and lower switch blocks or legs wherein the output of each pair is connected to a motor winding switch terminal. The upper switch blocks or legs are connected the P-channel switch a. The lower switch block or legs are connected to a negative power bus. The negative power bus permits the N-channel FETS or IGTS within the switch blocks or legs exposed to ionized radiation to be controlled, even when their gate threshold voltage has dropped below zero volts.

8 Claims, 2 Drawing Sheets

RADIATION HARDENED MOTOR DRIVE STAGE

FIELD OF THE INVENTION

The present invention relates to a motor drive state for brushless DC motors and stepper motors capable of tolerating the effect of a total ionizing radiation dose of between ranges of 1000 to 2000 Grays while using commercially available transistors that are not specifically radiation hardened. In particular, the present invention provides a cost effective motor drive stage capable of operating in a high ionizing radiation environment such as those employed in space satellites and particle accelerator applications.

THE RELATED ART

Motor drive stages are electronic switching devices that are powered by a DC power source. These motor drive stages apply voltage to motor windings in response to an external command. This voltage that is applied to the electronic motor communicators generates a torque that permits the motor to rotate. The windings are generally arranged in two or three stator phases.

Motor drive stages are used for a variety of uses including in spacecraft, satellites for high physics instrumentation. In such environments, the electronic commutators are exposed to various kinds of radiation damage and in particular to ionizing radiation.

Field Effect Transistors (FETs) are used in power switching types of applications. Enhancement mode N channel type FETs are typically used in power switching applications, however P channel types can also be used on occasion. Enhancement mode refers to the fact that the FETs are normally non-conductive until a gate drive signal is applied. The application of a gate voltage above a threshold level causes the FET conducts.

Typically N channel FETs are used for construction of motor drive stages because for any given die size transistor an N channel FET has a lower resistance than correspondingly sized P channel FET has. Further, N channel FETs are more commercially available with far more voltage and current ratings than are P channel FETs.

SUMMARY OF THE INVENTION

Conventional non-radiation hardened N Channels FETs employed when radiation is present tends to malfunction at relatively low radiation levels (approximately 250 Grays) due to the gate threshold voltage of the N-channel FET shifting more negatively, and ultimately falling close to either zero or becoming slightly negative.

This gate voltage threshold shift occurs in major part because the cumulative ionizing radiation traps electrical charges in the oxide layer that insulates the gate terminal from the source and the drain terminals.

At the point where a sufficient ionizing dose is applied to non-radiation hardened FETS, and N-channel FET conducts current with none or virtually no gate voltage applied, the N-channel FETs will become uncontrollable, unless the applied gate voltage has a range that extends above and below ground potential (relative to the N-channel FETs source terminal).

A conventional, non-traditional hardened P-channel FET has a gate threshold voltage that also will shift more negatively as it is exposed to radiation. The initial threshold voltage will never go through a region where the FETs are uncontrollable and only go from a negative value to a more negative value. Therefore, conventional P channel FETs could have a more robust response to a total dose effect that unconventional N-channel FETs would have if the proper gate drive signal is provided.

The gate drive signal must be sufficiently high in magnitude to saturate the drain to source channel for either unconventional N-channel or P-channel types. The gate drive signal can not however be so high that it exceeds the gate to source breakdown voltage rating of the FET. It is important to maximize the magnitude of the gate voltage signal, because the higher the signal magnitude is, than the higher that the radiation dose for the FETs will be. It is important to implement a negative gate bias when placing the FET in the off mode. The negative bias compensates for the effect of trapped charges within the gate oxide, thus permitting the N-channel FET to switch on and off, despite negative shifts in the gate threshold voltage.

The present invention relates to a radiation hardened motor drive stage that uses a non-radiation hardened P-channel FET switch. In particular, the present invention relates to a radiation hardened motor drive switch. The motor drive switch of the present invention is connected to three pairs of upper and lower switch blocks (or alternatively legs). The output of each pair of switch blocks (or legs) is connected to a respective motor winding switch terminal. The upper switch blocks (or legs) are connected to the P-channel FET switch. The lower switch blocks (or legs) are connected to a negative power bus. The negative power bus permits N-channel FETS or an IGBTS within the switch blocks (or legs) that are exposed to an ionized radiation to be controlled even when their gate threshold voltage have dropped below zero volts.

DETAILED DESCRIPTION OF THE PREFERRED EMBODIMENTS

Figure 1:
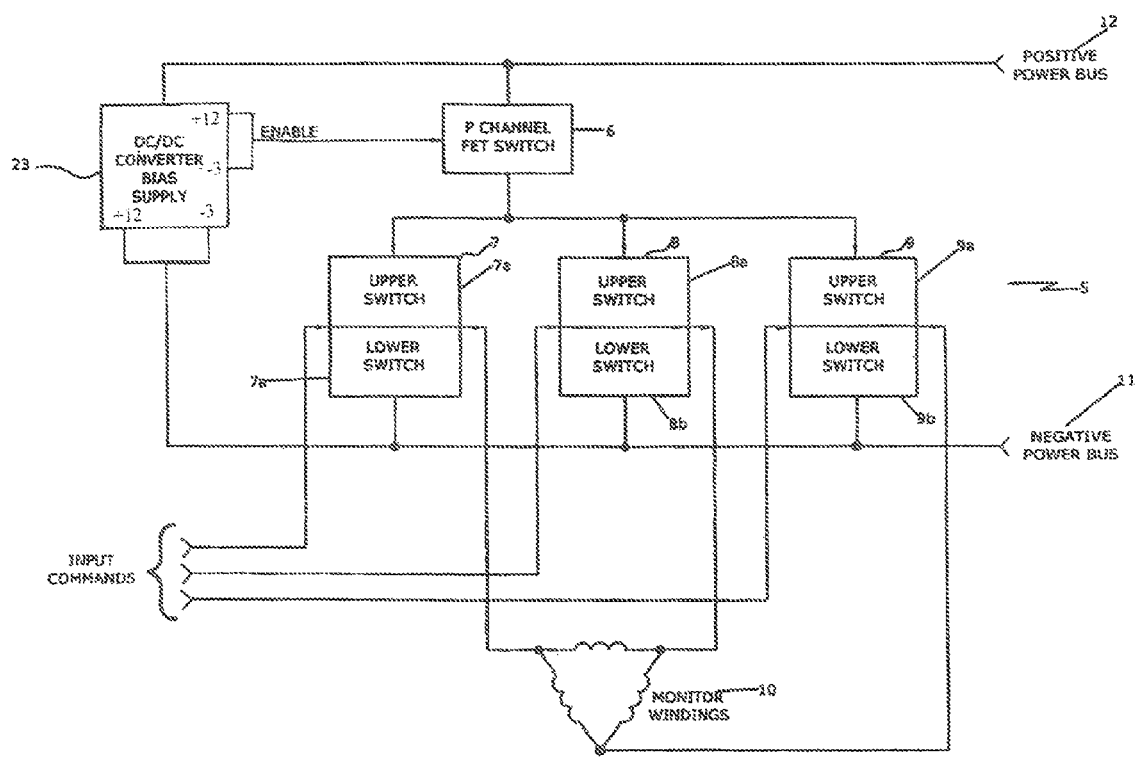
FIG. 1 illustrates the overall motor drive in accordance with the present invention.
Figure 2:
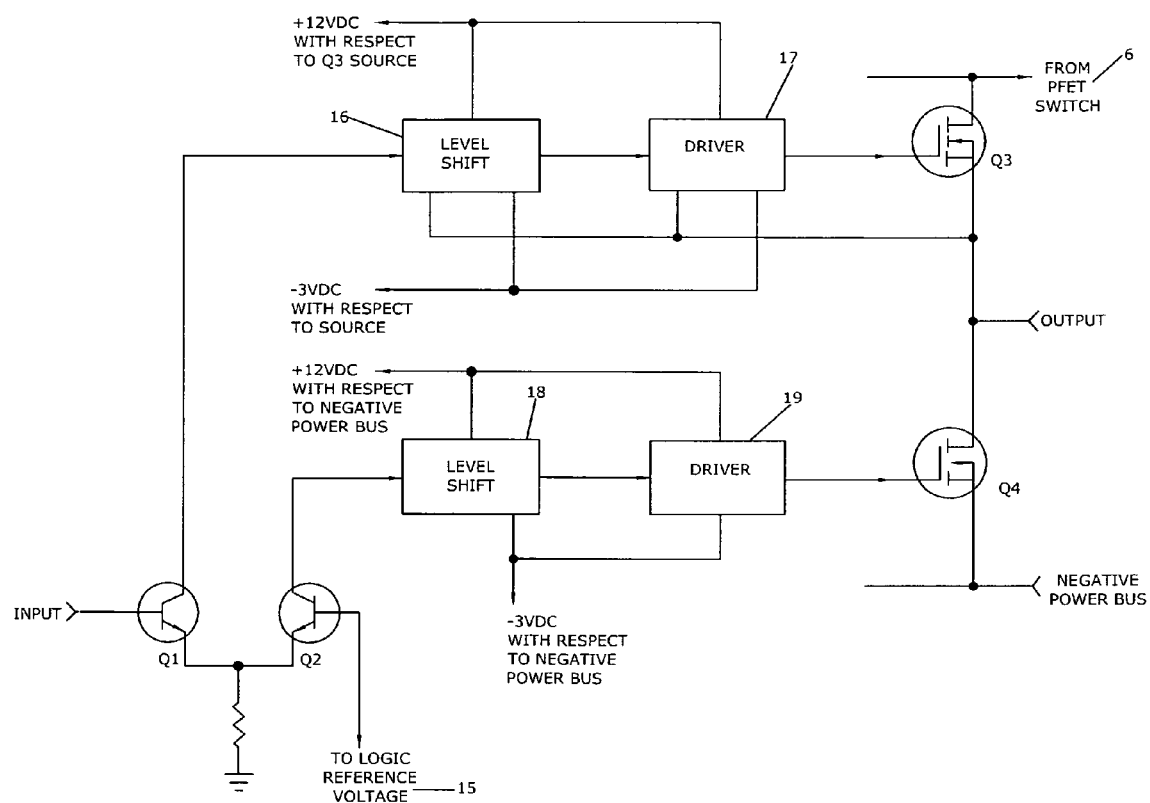
FIG. 2 illustrates one of the motor legs for the motor drive stage of FIG. 1 in accordance with the teachings of the present invention.

Referring now to the drawings of FIGS. 1 and 2, FIG. 1 shows a radiation hardened motor drive stage 5 that includes a P-channel FET switch 6 which feeds three (3) pairs, 7, 8 and 9 of upper 7a, 8a and 9a and lower switches 7a, 8b, and 9b blocks or legs, with the output of each pair of upper 7a, 8a and 9a and 7b, 8b and 9b blocks connected to a motor winding terminal 10. The upper switch blocks 7a, 8a and 9a are each connected to the output of the P-channel FET switch 6, while the lower switch blocks 7b, 8b and 9b are connected to the negative power bus 11.

In addition, the radiation hardened motor drive stage 5 also includes a DC-DC converter/bias supply 23. The DC-DC converter block 23 operates from the input power bus 12 and produces two pairs of isolated outputs. Each pair of isolated outputs produces a nominal voltage of +12 VDC and −3 VDC. The negative bias voltage 11 serves to control the ionizing radiation even when the gate threshold voltage drops below zero volts.

It is important that the switches 7, 8 and 9 within a given pair of upper and lower types do not conduct simultaneously, as that would cause a large current to flow from the upper power bus 12 to the lower power bus 11.

With the upper 7a, 8a and 9a and the lower 7b, 8b and 9b switch blocks, either a conventional, non-radiation hardened N-channel FET or a conventional, non-radiation hardened IGBT may be employed (see FIG. 2). It is advantageous to use an N-channel FET or an IGBT in the motor switch legs 7, 8 and 9 in place of a P-channel FET, because for a given die size, the on resistance of the N-channel FET or IGBT is lower than that of a P-channel FET. Since motor winding currents must flow through the switches, minimizing the on resistance of the switches decreases power losses within the radiation hardened motor drive stage 5.

By using a P-channel FET switch to provide power to the six motor drive legs, even though the P-channel FET gate characteristic shifts to a higher magnitude after exposure to ionizing radiation, the P channel FET is still controllable for the instant power application. By contrast, the six N-channels FET and IGBTS in the motor switch legs are conductive when no gate voltage is applied and after exposure to ionizing radiation, and therefore are not safe for an application of power unless a negative bias had been present.

The P-channel FET switch 6 may be comprised of single P-channel FET, or multiple units connected in series or parallel. The P-channel FET switch delays the application of power to the motor drive switches 7, 8 and 9 until the DC-DC converter 23 generates a sufficient negative bias which is applied to the N-channel FETS or IGBTS, so that the N-channel FETS or IGBTS are controllable to the off state even when exposed to ionizing radiation. Therefore, the P-channel FET switch 6 senses the magnitude of the negative bias voltage from the DC-DC converter 23 and will not turn on until a sufficient negative bias has been sensed.

Optimizing the voltage levels of P-channels FETS gate drive for performance both before and during its exposure to ionizing radiation is important. The negative gate drive amplitude should be made as large as possible, considering gate to source derating, so that the FET can function over the largest accumulation of ionizing radiation. The off gate drive level should be kept as close to zero as possible, not only to prevent an unwanted turn on of the FET, but also to prevent the degradation of the P-channel FET's ability to withstand the potentially damaging effects of energetic cosmic particles. This is achieved in practice with negative gate drive amplitude of −15 VDC and positive gate drive amplitude to motor rotor position.

The digital command signals are external inputs to the radiation hardened motor drive 5 and are applied to each pair of upper 7a, 8a and 9a, and lower 7b, 8b and 9b switch blocks. These commands are typically generated by a microprocessor or by some other logic device in conjunction with signals from sensors that are responsive to motor rotor position.

It is advantageous that the command input to the radiation hardened motor drives stage can interface to a variety of logic levels and advantageous that there can be a common mode different between the logic ground relative to the negative power bus in order to minimize susceptibly to electrical inference.

FIG. 2 shows a complementary motor leg 7, 8 or 9 of the present invention that uses an upper and lower N-channel FET.

The input command is fed to Q1, one transistor of differential pair. Q2, the other part of the differential pair is connected to the logic reference voltage. Settling of the logic reference voltage allows the threshold to be set for 5 volt CMOS, 5 volt TTL, and 3.3V or 2.5V logic trip levels.

When the negative bias supply is present, P-channel FET switch is closed and power is applied to the drain of Q3. The positive and negative bias voltages for the motor switch legs are also available at this time.

The input command signal from Q1 is passed to upper level shifter 16. The upper level shifter 16 converts Q1's signals to a level that is either +12 VDC (with respect on the state of Q3's source) or approximately −3 VDC (with respect to Q3's source), depending on the state of Q1. The output of the level shifter 16 is fed to a driver, stage 17, which lowers the impedance of the level shifter 16 output and helps to drive the capacitance of Q3's gate, for faster switching speeds. Since Q3's source can range between its drain potential (when on) to the negative power bus potential (when off), it is useful that the bias supplies for the upper FET Q3 are isolated from bus reference and can float on the source of Q3.

The lower shifter 18 and its associated gate driver 19 are driven by the collector signal from Q2 of the differential pair, which is inverted from the collector signal of Q1. This inversion insures that upper set of switches 7a, 8a and 9a, and the lower set of switches 7b, 8b and 9b switches are out of phase with respect to each other. Q2's collector signal through the lower level shifters 18 produces a gate drive for N-channel FET Q4. The gate drive alternates between −3 VDC when Q4 is off, to +12 VDC when Q4 is commanded.

The bias supply for the lower leg is referred to Q4's source terminal, which is the same potential as negative power bus. This is the same reference potential for all of the lower motor switches. Therefore, one common supply output can serve all three lower motor switches (7b, 8b and 9b).

The upper 16 and lower 18 level shifters translate the motor drive commands up to the positive power bus potential, then down to the reference voltage needed for the FET drive circuits. This translation results in a common mode voltage difference between the return potential of the electric motor communicator signal inputs and the negative power bus. The ability to operate properly, despite common mode voltage differences provides noise immunity between the low power command signals and the high power terminals.

For performance before and during exposure to the ionizing radiation, it is important to optimize the voltage levels of Q3 and Q4's gates drive. The positive drive amplitude should be sufficient to produce the lowest possible saturation residence, considering gate to source derating. The gate drive level should be sufficiently negative with respect to the source to allow the FET to turn off, considering the largest accumulation of ionizing radiation. However, the off gate drive level should be as close to zero as possible to prevent degradation of the N-channel FETs ability to withstand the potentially damaging effects of energetic cosmic particles. In present particles, this is accomplished with a positive amplitude of 12 VDC and a negative amplitude of −3VDC.

While certain embodiments have been shown and described, it is distinctly understood that the invention is not limited thereto, but may be otherwise embodied within the scope of the appended claims.

What is claimed is:

1. A radiation hardened motor drive stage, comprising:
   (a) a non radiation hardened P-channel FET switch connected to each of three pairs of upper and lower switch blocks or legs of said motor drive stage, where each output of a representative one of said three pairs of switch blocks or legs is connected to a respective winding terminal of a motor, said upper switch blocks or legs being connected to an output of said FET switch and said lower blocks or legs being connected to a negative power bus; and (b) a DC-DC converter bias supply that operates from an input power bus and enables said non-radiation hardened P-channel FET switch, wherein (1) the three pairs of upper and lower switch blocks or legs, each have either a non-radiation hardened N-channel FET or a non-radiation hardened IGBT, (2) said DC-DC converter produces two pairs of isolated outputs to control one or more of the three pairs of switch blocks or legs that has been exposed to ionizing radiation, and (3) a negative bias voltage of the DC-DC converter further serves to control the ionizing radiation even when gate thresholds for the upper and lower switch blocks or legs drop below zero.

2. The motor drive stage according to claim 1, wherein said P-channel FET is a single P-channel FET.

3. The motor drive stage according to claim 1, wherein said P-channel FET is formed of multiple units of P-channel FETS connected either in series or parallel.

4. The motor drive stage according to claim 1, wherein each of said switch blocks or legs include upper and lower level shifters for translating motor drive commands to a positive power bus potential and then to a reference voltage potential so that said upper and lower switch blocks or legs do not conduct simultaneously.

5. A radiation hardened motor drive stage, comprising:
(a) a non-radiation hardened P-channel FET switch connecting each of three (3) pairs of upper and lower switch blocks or legs of said motor drive stage where each output of a respective one of said three (3) pairs of switch blocks or legs is connected to a respective winding terminal of a motor, said upper switch blocks or legs being connected to an output of said FET switch and said lower blocks or legs being connected to a negative power bus; and (b) a DC-DC converter bias supply that operates from an input power bus and enables said non-radiation hardened P-channel FET switch, wherein (1) the three pairs of upper and lower switch blocks or legs, each have either a non-radiation hardened N-channel FET or a non-radiation hardened IGBT, (2) said DC-DC converter produces two pairs of isolated outputs to control one or more of the three pairs of switch blocks or legs that has been exposed to ionizing radiation, and (3) a negative bias voltage of the DC-DC converter further serves to control the ionizing radiation even when gate thresholds for the upper and lower switch blocks or legs drop below zero.

6. The radiation hardened motor drive stage according to claim 5, wherein said P-channel FET switch is a single P-channel FET.

7. The radiation hardened motor drive stage according to claim 5, wherein said P-channel FET switch is formed of multiple units of P-channel FETS connected either in series or parallel.

8. The radiation hardened motor drive stage according to claim 5, wherein each of said switch blocks or legs include upper and lower level shifters for translating motor drive commands to a positive power bus potential and then to a reference voltage potential so that said upper and lower switch blocks or legs do not conduct simultaneously.

* * * * *